(12) United States Patent
Narampanawe et al.

(10) Patent No.: US 11,996,701 B2
(45) Date of Patent: May 28, 2024

(54) HEARING DEVICE AND CIRCUIT BOARD FOR A HEARING DEVICE

(71) Applicant: Sivantos Pte. Ltd., Singapore (SG)

(72) Inventors: Nishshanka Bandara Narampanawe, Singapore (SG); Heng Goh Yap, Singapore (SG); Chuan En Andrew Ong, Singapore (SG); Sooriya Bandara Rathnayaka Mudiyanselage, Singapore (SG)

(73) Assignee: Sivantos Pte. Ltd., Singapore (SG)

( * ) Notice: Subject to any disclaimer, the term of this patent is extended or adjusted under 35 U.S.C. 154(b) by 225 days.

(21) Appl. No.: 17/574,809

(22) Filed: Jan. 13, 2022

(65) Prior Publication Data

US 2022/0224155 A1 Jul. 14, 2022

(30) Foreign Application Priority Data

Jan. 13, 2021 (DE) ..................... 10 2021 200 249.8

(51) Int. Cl.
*H04R 25/00* (2006.01)
*H01M 10/04* (2006.01)
*H01M 10/42* (2006.01)
*H01M 10/46* (2006.01)
*H02J 50/00* (2016.01)
(Continued)

(52) U.S. Cl.
CPC ......... *H02J 50/10* (2016.02); *H01M 10/0422* (2013.01); *H01M 10/425* (2013.01); *H01M 10/46* (2013.01); *H02J 50/005* (2020.01); *H04R 25/602* (2013.01); *H04R 25/609* (2019.05); *H05K 1/0298* (2013.01); *H05K 1/165* (2013.01); *H01M 2010/4271* (2013.01); *H01M 2220/30* (2013.01); *H04R 2225/021* (2013.01);
(Continued)

(58) Field of Classification Search
CPC ...... H02J 50/10; H02J 50/005; H02J 7/00712; H05K 1/0298; H05K 1/165; H05K 2201/10037; H01M 10/0422; H01M 10/425; H01M 10/46; H01M 2010/4271; H01M 2220/30; H04R 25/602; H04R 25/609; H04R 2225/021; H04R 2225/31; H04R 25/55; H04R 2225/51; H04R 1/1025; H04R 2225/33
See application file for complete search history.

(56) References Cited

U.S. PATENT DOCUMENTS 10,321,246 B2 6/2019 Flaig et al.
10,536,788 B2 1/2020 Nikles et al.
(Continued)

FOREIGN PATENT DOCUMENTS

DE 102014219017 A1 3/2016
DE 102017209813 B3 9/2018
KR 20200030786 A 3/2020

*Primary Examiner* — Brian Ensey
(74) *Attorney, Agent, or Firm* — Laurence A. Greenberg; Werner H. Stemer; Ralph E. Locher

(57) ABSTRACT

A hearing device has a battery module. The battery module has a secondary cell and a reception coil for contactless charging of the secondary cell. The battery module has a circuit board with a conductor track which forms the reception coil. The circuit board contains a plurality of layers. The conductor track extends over the plurality of layers while containing a conductor loop, which has at least one turn, in each of the plurality of layer. A corresponding circuit board is furthermore specified.

16 Claims, 5 Drawing Sheets

(51) Int. Cl.
*H02J 50/10* (2016.01)
*H05K 1/02* (2006.01)
*H05K 1/16* (2006.01)

(52) U.S. Cl.
CPC ............... *H04R 2225/31* (2013.01); *H05K 2201/10037* (2013.01)

(56) References Cited

U.S. PATENT DOCUMENTS

| | | |
|---|---|---|
| 2013/0089232 A1* | 4/2013 | Kim .................. H04R 7/04 |
| | | 381/431 |
| 2013/0127404 A1 | 5/2013 | Maenpaa |
| 2013/0175983 A1 | 7/2013 | Partovi et al. |
| 2014/0176060 A1 | 6/2014 | Vorperian et al. |
| 2020/0021127 A1* | 1/2020 | Itagaki ................ H04R 25/602 |

* cited by examiner

HEARING DEVICE AND CIRCUIT BOARD FOR A HEARING DEVICE

CROSS-REFERENCE TO RELATED APPLICATION

This application claims the priority, under 35 U.S.C. § 119, of German Patent Application DE 10 2021 200 249.8, filed Jan. 13, 2021; the prior application is herewith incorporated by reference in its entirety.

FIELD AND BACKGROUND OF THE INVENTION

The invention relates to a hearing device and to a circuit board therefor.

A hearing device is conventionally used to output an audio signal to a user of the hearing device. The output is carried out by means of an output transducer, usually acoustically through airborne sound by means of a so-called pickup, which is also referred to as a loudspeaker or receiver. One special configuration of a hearing device is a hearing aid apparatus, also referred to in brief as a hearing aid, for assisting a user who has a hearing impairment. To this end, the hearing device normally contains at least one acoustic input transducer, typically a microphone, and a signal processor. The signal processor is configured to process an input signal which is generated from ambient sound by the input transducer, and thereby to compensate at least partially for the user's hearing impairment. Especially in the case of a hearing aid, a variant is also possible in which the output transducer is next to a so-called bone conduction pickup or cochlear implant for mechanical or electrical coupling of the audio signal into the user's auditory system. The general term "hearing device" also includes in particular apparatuses such as, for example, so-called tinnitus maskers, headsets, earphones and the like.

In order to supply electronic components of the hearing device, in particular the output transducer, signal processor, etc., with energy, the use of a rechargeable energy storage unit is advantageous, especially in the form of secondary cells, also referred to as rechargeable batteries. In principle, it is in this case conceivable to replace conventional battery formats with secondary cells of the same format. Since the latter often output different voltage values, however, converter electronics are regularly necessary as part of the hearing device for voltage conversion, in order to produce the required voltage values for the electronic components, so that mere replacement is usually not possible. Furthermore, recharging of the secondary cells should also be possible without removing them from the corresponding hearing device, in order to increase the convenience of use. Since hearing devices are regularly worn on the body and therefore exposed to bodily fluids, in particular sweat, contactless and especially wireless charging is furthermore desirable so that the housing of the hearing device can then be made particularly impermeable to environmental influences, in particular moisture-tight.

Contactless charging is possible inductively by means of a charging coil of the hearing device, which is inductively coupled during charging operation to a transmission coil that is a part of a charger for the hearing device. "Contactless" generally means that the charging specifically requires no DC connection between the charger and the hearing device. Simple mechanical coupling, for example in order to hold the hearing device on the charger, especially during charging, is however possible in this case. The charging coil is also referred to as a "reception coil" or "secondary coil", and the transmission coil is also referred to as a "primary coil". In this case, however, charging electronics for controlling the charging process are required as part of the hearing device, possibly in addition to converter electronics as described above. These charging electronics are regularly combined together with the secondary cell in a so-called battery module of the hearing device.

For inductive charging, the most accurate possible relative alignment of the charging coil with respect to the transmission coil is desirable. Furthermore, the two coils should also be arranged at the smallest possible distance from one another, for example at a distance of a few millimeters, for example 3 mm. Otherwise, the possible energy efficiency in the energy transmission is impaired, which leads to long charging cycles or insufficient charging.

SUMMARY OF THE INVENTION

The object of the invention is to improve contactless charging of a secondary cell in a hearing device.

The object is achieved according to the invention by a hearing device having the features according to the independent hearing device claim and by a circuit board having the features according to the independent circuit board claim. Furthermore, the object is also achieved in particular by a battery module which has such a circuit board and is intended for such a hearing device.

Advantageous configurations, refinements and variants are the subject-matter of the dependent claims. The comments relating to the hearing device also apply correspondingly for the circuit board and the battery module, and vice versa.

The hearing device contains a battery module. The battery module is, in particular, accommodated in a housing of the hearing device. The battery module comprises a secondary cell, which is used in particular to supply energy to one or more components of the hearing device. The battery module furthermore contains a reception coil for contactless charging of the secondary cell. The reception coil is therefore also referred to as a charging coil.

"Contactless" generally means that the charging specifically requires no DC connection between the charger and the hearing device. Simple mechanical coupling, for example in order to hold the hearing device on the charger, especially during charging, is however possible in this case. The contactless charging is carried out during charging operation for the hearing device preferably by a magnetic field in an inductive resonant charging method, so that the contactless charging is then inductive charging. For the contactless charging, a charger having a transmission coil, which is also referred to as a "primary coil", is used. The reception coil and the transmission coil are respectively also in general referred to as a coil. During the charging, energy is transmitted from the charger to the hearing device by means of the coils, and the secondary cell is thereby charged.

At least the housing, and preferably the hearing device as a whole, is worn during intended use in particular fully in the region of the user's head, preferably laterally on the head and in, on or behind the ear. The hearing device is correspondingly compact, so that corresponding requirements are placed on it and its individual components, namely a design which is as compact as possible and use of installation space which is as efficient as possible.

The battery module furthermore comprises a circuit board having a conductor track, which forms the reception coil. The circuit board is also referred to as a printed circuit board or printed circuit (abbreviated to PCB). The conductor track is made in particular from a conductive material, preferably copper, and is applied on a substrate of the circuit board or embedded in the substrate, or both.

The circuit board furthermore comprises a plurality of layers, an individual layer also being referred to as a sheet. The term "layer" denotes in particular an individual plane which carries one or more conductor tracks. The circuit board is accordingly a multilayer circuit board having at least two layers. For example, an upper side and a lower side of the circuit board respectively form a layer, so that the circuit board is a double-sided circuit board. As an alternative, the circuit board contains more than two layers and is then a so-called multilayer circuit board. The layers are stacked above one another in a stack direction. The circuit board is configured overall in particular flatly, i.e. in the form of a plate, and preferably has a thickness in the range of from 0.5 mm to 5 mm. The thickness of the circuit board is measured in the stack direction, i.e. perpendicularly to the layers. The circuit board is configured to be either planar or bent, i.e. it does not necessarily extend along a single flat plane but, depending on the configuration of the hearing device, possibly follows a curved or bent profile, for example in order to adapt to a contour in or on the housing or a component of the hearing device. Particularly preferably, the circuit board is flexible, i.e. pliable and resilient, in order for example to follow a curved profile.

The conductor track extends over the plurality of layers while containing a conductor loop, having at least one turn, in each of the plurality of layers. In this way, the reception coil having a corresponding number of turns is formed. The specific dimensions of the turns and their arrangement determine the transmission properties of the reception coil. Preferably, the conductor loops of the different layers are configured substantially in the same way and more preferably are substantially congruent when viewed in the stack direction. In this case, "substantially" means in particular "at least 90%". Like the circuit board, the conductor track is preferably also flexible and, to this end, in particular is configured as a flat track.

A turn is characterized in that it extends entirely within a single layer. Furthermore, a turn is characterized in that it forms an open loop, i.e. in particular it circumscribes a free space (or inner region) as fully as possible but while not being closed. A respective turn accordingly comprises two ends which are not connected to one another, but preferably lie laterally next to one another within the layer. The turn is preferably rectangular, or alternatively round or differently shaped.

The use of a circuit board having a specially configured conductor track is, in particular, a key concept of the invention. The conductor track is in this case configured as a coil by the conductor track forming a plurality of conductor loops which are distributed between different layers of the circuit board. In this way, a reception coil for contactless charging is produced simply and compactly. The use of a conductor track as the reception coil leads, owing to the particularly flat configuration, to a particularly favorable form factor with which the reception coil is particularly flat overall, regularly being flatter than coils with similar transmission properties which are wound from wire. In particular, a circuit board avoids an end overlap of the conductor track leading to thickening, as is the case with a wire coil in which one of the wire ends must be fed out from the interior of the coil for connection. Furthermore, conductor tracks of circuit boards may be produced reproducibly and with particularly high accuracy, and are therefore particularly suitable for mass production. Typically, conductor tracks may be manufactured reproducibly with a tolerance of less than 10 µm. In comparison thereto, the production of, for example, manually wound coils is much less accurate and the coils have greater deviations from one another. Machine-wound coils, however, sometimes also have deviations from one another which are greater than when producing a conductor track. Two coils produced in principle in the same way on the basis of a wire therefore do not necessarily have the same transmission properties. This also entails different resonant frequencies. In order to compensate for this, it is possible to use a tuning capacitor with which the resonant frequency is retrospectively corrected. This, however, requires an additional component part and also increased outlay since the necessary capacitance and the corresponding capacitor have to be newly determined and selected for each coil. This has a detrimental effect on costs and speed during production.

Preferably, the conductor loops together form a helix and the turns of a respective conductor loop form a spiral, so that the reception coil is configured as a spiroplanar helical coil. The turns of a respective conductor loop then form a spiral within the corresponding layer. Owing to the fact that the conductor track extends over a plurality of layers, a helix is then formed. Overall, a plurality of spirals are thus arranged above one another in the stack direction and are connected in series to one another in such a way that a helix is formed. To this end, one of two ends of a respective spiral is connected to an end of a spiral of the conductor loop lying above, and the other of the two ends is connected to an end of a spiral of the conductor loop lying below. In order to form a helix, at least two conductor loops, i.e. two layers, are required. In order to form a spiral, at least two turns within a layer are required. The spiroplanar helical configuration of the coil combines the advantages on the one hand of a particularly high inductance and on the other hand of a particularly compact design.

In one particularly preferred configuration, the reception coil comprises precisely two conductor loops, each having precisely two turns, so that there are in total four turns, which are distributed between two layers. This configuration is particularly suitable for hearing aids. Furthermore, production with only two layers is particularly simple, a conductor loop simply being formed respectively on the upper side and lower side of the circuit board.

Suitably, the conductor loops are conductively connected by means of a through-contact and are interconnected in series. The through-contact is also referred to as a "via". The through-contact is in particular embedded in the substrate of the circuit board, for example as a hole with a metallized inner wall or with a metal sleeve fitted therein, and thus reaches from one layer to the neighboring layer. The through-contact extends particularly in the stack direction, and therefore perpendicularly to the layers. In each case two conductor loops are conductively connected by a through-contact, so that a series circuit of the conductor loops is obtained overall. The number of through-contacts is then one less than the number of conductor loops.

Because of the turns, a respective conductor loop comprises in particular an inner end and an outer end, and two inner ends or two outer ends are then always connected to one another by means of a respective through-contact. The two remaining ends of the top and bottom conductor loops are then respectively connected to a terminal contact for connecting the coil for example to the secondary cell, to converter electronics, to charging electronics, or a combination thereof.

In general, the circuit board comprises two terminal contacts, which are respectively connected to an end of the conductor track, in order to connect the reception coil. The terminal contacts are preferably arranged together in one of the layers of the circuit board, to which end, in particular, for at least one of the terminal contacts there is a through-contact which connects this terminal contact to an end of the conductor track in another layer.

Preferably, the hearing device comprises charging electronics for controlling the charging process for the secondary cell. In one suitable configuration, as an alternative or in addition, the hearing device comprises converter electronics for voltage conversion in order to produce suitable voltage values for the electronic components. The charging electronics or the converter electronics, or both, are in particular produced as integrated circuits or circuitry, or in a similar way, as part of the circuit board and therefore part of the battery module.

Preferably, the conductor track has a width in the range of from 200 µm to 500 µm and a thickness in the range of from 10 µm to 100 µm. These dimensions provide particularly suitable transmission properties. The conductor track preferably has a rectangular cross section, the width then being measured along the layer and the thickness perpendicularly to the layer.

Table 1 below describes six advantageous configurations A-F of the reception coil and its transmission properties, which were determined by means of a simulation:

TABLE 1

| Config-uration | Number of layers | Number of turns | Width of the conductor track [mm] | Thickness of the conductor track [µm] | Inductance [nH] | Resistance [mΩ] | Q factor |
|---|---|---|---|---|---|---|---|
| A | 2 | 4 | .3 | 0 | 37 | 90 | 9.3 |
| B | 2 | 4 | .3 | 5 | 49 | 50 | 7.9 |
| C | 2 | 4 | 0.3 | 7.5 | 56 | 50 | 3.8 |
| D | 2 | 4 | .4 | 0 | 13 | 50 | 9.1 |
| E | 2 | 4 | .4 | 5 | 23 | 80 | 7.4 |
| F | 4 | 4 | .3 | 18, 12, 12, 18 | 40 | 50 | 2 |

All six configurations A-F according to Table 1 comprise a conductor track with four turns. In configuration F, each turn is arranged in its own layer, while in configurations A-E two layers are respectively formed, each having a conductor loop with two turns. The width of the conductor track is 0.3 mm for A, B, C, F and otherwise 0.4 mm. The thickness of the conductor track is respectively the same in configurations A-E for all respective conductor loops, while in configuration F the conductor loops of the middle two layers have a smaller thickness than the conductor loops of the outer layers. The last column indicates the Q factor, i.e. quality factor, of the reception coil. The Q factor, abbreviated to "Q", also determines the quality of the coupling between the two coils.

The Q factor is dependent on the dimensions of the conductor track. In particular, the conductor track has a cross section which determines the resistance, or more precisely the AC resistance (denoted $R_{AC}$), of the conductor track. A reduction of the cross section usually leads to an increase in the resistance. A large cross section, i.e. a large width, is therefore advantageous in principle since the thickness is typically less flexibly selectable than the width because of the laminar structure and the way in which the circuit board is produced. The cross section is given by the product of width and height, for example of width and height as indicated in Table 1 above. The resistance $R_{AC}$ is frequency-dependent and is given according to the following equation:

$$R_{AC}(f)=[(2.16\times10^{-7})\sqrt{(f\cdot\rho_R)}]/[2(w+d)].$$

Here, w is the width, d is the thickness of the conductor track, f is the frequency in Hz, $\rho_R$ is the relative resistivity of the conductor track in comparison with copper with $\rho_R=1$. For equal external dimensions of a conductor loop, however, a smaller width leads to a larger free area which is circumscribed by the conductor loop, and therefore a higher inductance of the coil. Correspondingly it is necessary to make a compromise between a resistance which is as low as possible on the one hand, and an inductance which is as high as possible on the other hand.

As revealed by Table 1 above, an equal thickness but different width leads both to a higher inductance and to a higher resistance for the configurations with a smaller width, cf. for example configurations A and D or B and E. The difference in the Q factor is, however, insubstantial in this case.

A different thickness with otherwise the same configuration gives according to Table 1, for a smaller thickness, a lower inductance but a significantly increased resistance, which in combination has a large influence on the Q factor. Accordingly, a thickness which is as large as possible is preferred since this leads to a higher Q factor, cf. for example configurations A, B, C.

Lastly, Table 1 shows that configurations with two layers (configurations A-E) are preferred over configurations with four layers (configuration F) since a higher Q factor is then obtained. Moreover, configurations with fewer layers advantageously also have lower production costs and are preferable if only for this reason.

Table 2 below shows three configurations of the reception coil and its parameters, especially the Q factor, in a similar way to Table 1 above, although the data specified are based on measurements of actually manufactured prototypes of the circuit board and not on a simulation. The references A, B, C in Table 2 do not correlate with the references of Table 1.

TABLE 2

| Configuration | Width [mm] | Thickness | Inductance [nH] | Resistance [mΩ] | Q |
|---|---|---|---|---|---|
| A | 0.3 | 2 oz/70 µm | 127.84 | 334.29 | 32.58 |
| B | 0.4 | 1 oz/35 µm | 119.15 | 424.78 | 23.90 |
| C | 0.4 | 2 oz/70 µm | 99.85 | 34.7 | 34.70 |

The actual measurement values in Table 2, in contrast to Table 1, also take into account production parameters, for example the purity of the copper from which the conductor track is produced, the material of the circuit board, etc.

Furthermore, in the configurations of Table 2 there is also respectively a ferrite layer, specifically in a central position, as explained in more detail below. All three configurations A, B, C comprise two conductor loops in two layers and two turns per conductor loop, i.e. in total four turns. The large influence of the thickness and the negligible influence of the width may be seen clearly. Because of the Q factor, configurations A and C are generally preferred, and configuration C is particularly preferred.

Advantageously, the circuit board contains an additional ferrite layer, which fully covers the conductor loops, for amplifying the inductance of the reception coil. The ferrite layer consists in particular of a ferrite, and is connected to the rest of the layers for example by means of an adhesive, for example an adhesive layer, i.e. it is adhesively bonded onto one of the layers, onto another layer or onto the substrate of the circuit board. Preferably, the ferrite layer is adhesively bonded onto an outer one of the layers and thus forms a termination in the stack direction, so that the reception coil is arranged entirely on only one side of the ferrite layer. The ferrite layer is in this case preferably arranged on the side of the reception coil which faces away from the transmission coil during the contactless charging. The ferrite layer is thus emphatically not arranged between the two coils.

The ferrite layer is used to amplify the magnetic field which is generated by the transmission coil during the contactless charging and to increase the magnetic flux density in the immediate vicinity of the ferrite layer. The ferrite layer is therefore preferably arranged in immediate proximity to the reception coil, in order to deviate and concentrate the magnetic field in the direction of the latter and thereby achieve better coupling to the transmission coil. The ferrite layer also has an influence on the Q factor, which is determined in particular by the material of the ferrite layer. As a measure of the energy loss due to the magnetic material of the ferrite layer, a so-called loss tangent is used, which is inversely proportional to the Q factor and is defined by the following equation:

$$\tan \delta = 1/Q = \mu''/\mu'.$$

Here, "tan δ" is the loss tangent, $\mu''$ is the imaginary part of the complex relative permeability and $\mu'$ is the real part of the complex relative permeability. The equation above shows that lower losses lead to a higher Q factor, i.e. to improved transmission properties. The loss tangent is typically frequency-dependent. The reception coil has a resonant frequency, preferably a resonant frequency of 13.56 MHz. The resonant frequency is used for the energy transmission. The transmission coil has, in particular, the same resonant frequency as the reception coil. At the resonant frequency, the loss should be as low as possible, i.e. in particular the loss tangent for the resonant frequency is preferably less than 0.02. The selection of the material for the ferrite layer is then made in particular according to the aforementioned constraint, i.e. the ferrite layer then consists of a material having a loss tangent of at most 0.02 at the resonant frequency of the reception coil.

The ferrite layer is preferably likewise flexible.

In general: the larger the dimensions of the ferrite layer, the greater the inductance of the reception coil is. In each case, it is advantageous for the ferrite layer to cover the conductor loops and the entire reception coil fully, i.e. not just partially. This is based on the observation that different positions of the ferrite layer relative to the reception coil lead to different inductances. This is illustrated by Table 3 below, which indicates the inductance for different positions relative to a centered position. The positions are specified as a displacement in the X and Y directions, which are perpendicular to the stack direction, which is also a Z direction. In the centered position, the midpoints of the ferrite layer and of the conductor loops lie along a straight line in the stack direction and the ferrite layer extends perpendicularly to the stack direction, i.e. in the X and Y directions, as far as conductor loops at least in such a way that they are fully covered. In Table 3, the centered position is produced in configuration A, which also shows the highest inductance. Configurations A-I of the conductor track according to Table 3 do not correlate with the configurations of Tables 1 and 2, but are in principle independent thereof.

TABLE 3

| Configuration | X displacement [mm] | Y displacement [mm] | Inductance [nH] |
|---|---|---|---|
| A | 0 | 0 | 149.38 |
| B | 0 | 0.25 | 146.64 |
| C | 0 | 0.5 | 141.96 |
| D | 0.25 | 0 | 147.77 |
| E | 0.25 | 0.25 | 144.98 |
| F | 0.25 | 0.5 | 140.17 |
| G | 0.5 | 0 | 145.06 |
| H | 0.5 | 0.25 | 142.15 |
| I | 0.5 | 0.5 | 137.27 |

The X and Y displacements in configurations B-I according to Table 3 lead to the ferrite layer no longer covering the conductor loops fully, and therefore not exerting an optimal effect for the magnetic field.

In one expedient configuration, the circuit board contains a recess inside the conductor loops and the ferrite layer contains an elevation which protrudes into the recess, so that the elevation is arranged inside the turns and forms a ferrite core for the reception coil. The elevation is also referred to as a "stamp" since the elevation protrudes from the rest of the ferrite layer in the stack direction and forms an offset surface which protrudes into the free space inside the conductor loops. Because of the elevation, the ferrite layer generally comprises more material so that the density of the magnetic field is increased further, especially at the center of the reception coil. In this way, the coupling of the coils is improved further. The recess is for example cut into the circuit board, and preferably extends fully through the circuit board so that the recess correspondingly forms a hole in the circuit board. The elevation of the ferrite layer has, in particular, a circumferential contour which generally follows an inner contour of the conductor loops, so that the available free space is optimally used and filled with the ferrite layer.

Preferably, the secondary cell is cylindrical and has a lateral surface, and the circuit board as well as the reception coil are curved and follow the lateral surface. In this regard, it is advantageous for the circuit board to be flexible, and therefore correspondingly pliable, as already described above. For example, the secondary cell is configured in the manner of a button cell and is therefore cylindrical overall. The cylindrical secondary cell generally extends in a longitudinal direction along a longitudinal axis. The lateral surface encircles the longitudinal axis and bounds the secondary cell in a radial direction perpendicular to the longitudinal direction. The circuit board then preferably has a curved profile, in such a way that the circuit board is likewise curved around the longitudinal axis of the secondary cell. The stack direction of the circuit board therefore corresponds to the radial direction. The reception coil is then correspondingly curved. In this way, the circuit board is accommodated in a particularly space-saving fashion. Compared with arrangement of the circuit board on an end face of the secondary cell, the radial arrangement preferred here is advantageous since it allows freer configuration and positioning of the reception coil.

Expediently, a shielding layer, which preferably consists of copper, is arranged between the circuit board and the secondary cell. The shielding layer is used to reduce the overall resistance of the secondary cell, and also to reduce the influence of the skin effect. Usually, the secondary cell has a particularly high relative permittivity and generates strong eddy currents by interaction with the magnetic field. In this way, in particular, the temperature of the secondary cell also rises. Overall, in the radial direction as seen from the inside outward, there is a preferred arrangement such that the secondary cell is arranged internally, then the shielding layer, then—if present—the ferrite layer and lastly the circuit board with the reception coil. Further outward, these are then finally in particular also followed by the housing of the hearing device.

The hearing device is preferably a BTE hearing aid (BTE=behind the ear) or an RIC hearing aid, i.e. a hearing aid in which the pickup is worn in the ear canal (RIC=receiver in canal). In the case of both a BTE hearing aid and an RIC aid, the housing is worn by a user behind the ear and specifically not in the ear, as in the case of an ITE aid. In the case of a BTE hearing aid, the pickup for sound output is arranged in the housing and a sound tube leads when worn from the housing into the user's ear. In the case of an RIC hearing aid, the pickup for sound output is, in contrast, arranged outside the housing and when worn is inserted into the ear canal. The pickup is connected to the housing by means of an electrical line.

Other features which are considered as characteristic for the invention are set forth in the appended claims.

Although the invention is illustrated and described herein as embodied in a hearing device and a circuit board for a hearing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
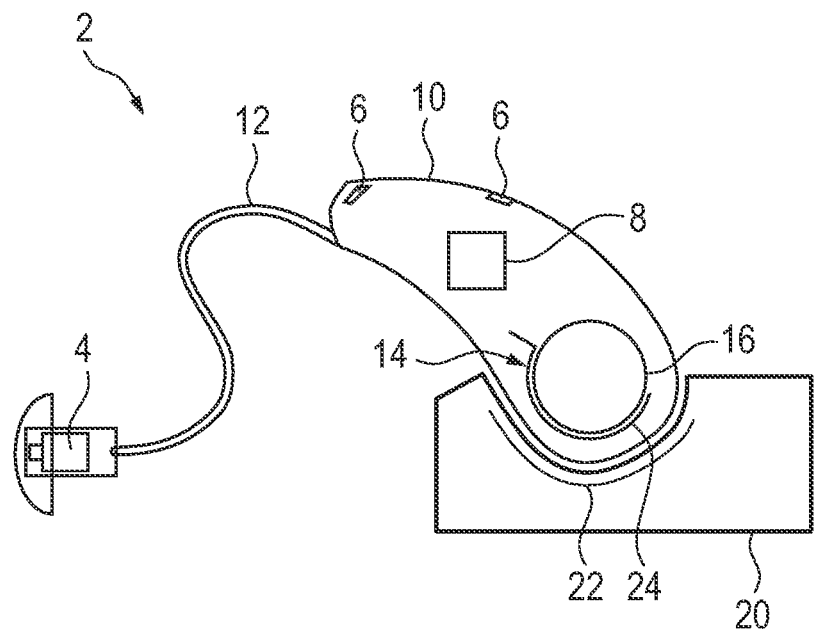
FIG. 1 is an illustration showing a hearing device and a charger.

The hearing device 2 shown in FIG. 1 is in particular an RIC hearing aid, i.e. a hearing aid in which the pickup 4 is worn in the ear canal (RIC=receiver in canal). In one variant, which is not explicitly shown, the hearing device 2 is a BTE hearing aid (BTE=behind the ear). In the case of both a BTE hearing aid and an RIC aid, the housing 10 is worn by a user behind the ear and specifically not in the ear, as in the case of an ITE aid. In the case of a BTE hearing aid, the pickup 4 for sound output is arranged in the housing 10 and a sound tube leads when worn from the housing 10 into the user's ear. In the case of an RIC hearing aid, conversely and as may be seen in FIG. 1, the pickup 4 for sound output is arranged outside the housing 10 and when worn is inserted into the ear canal. The pickup 4 is connected to the housing 10 by means of an electrical line 12.

Figure 2:
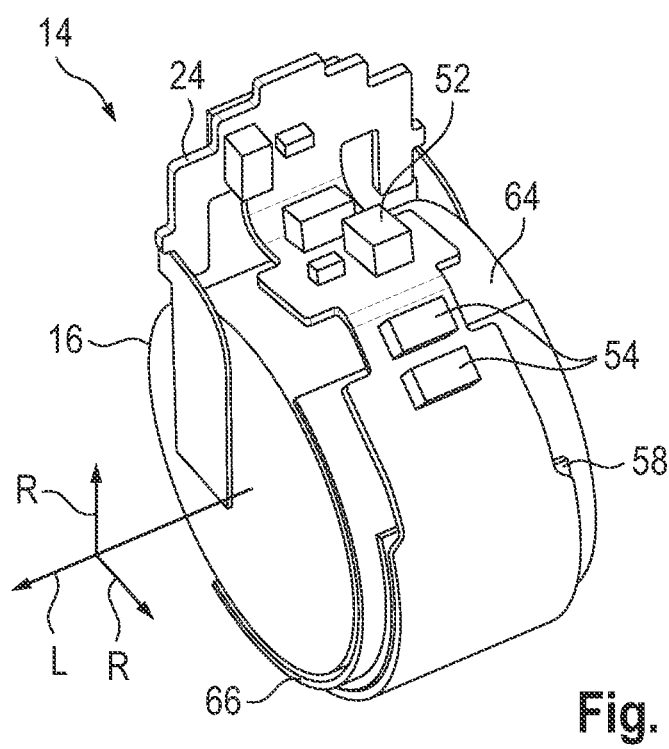
FIG. 2 is a diagrammatic, perspective view of a battery module of the hearing device of FIG. 1, with a circuit board.

The hearing device 2 contains a battery module 14, which is represented only in a very schematized way in FIG. 1. FIG. 2 shows an embodiment of the battery module 14 in detail. The battery module 14 is accommodated in the housing 10 and comprises a secondary cell 16 for supplying energy to one or more components of the hearing device 2. The battery module 14 furthermore comprises a reception coil 18 for contactless charging of the secondary cell 16. The reception coil 18 is therefore also referred to as a charging coil.

The contactless charging is carried out in the present case during charging operation for the hearing device 2 by a magnetic field in an inductive resonant charging method. For the contactless charging, a charger 20 having a transmission coil 22, which is also referred to as a "primary coil", is used. An example of this may be seen in a greatly simplified fashion in FIG. 1. Correspondingly, the reception coil is also referred to as a "secondary coil". The reception coil 18 and the transmission coil 22 are respectively also in general referred to as a coil. During the charging, energy is transmitted from the charger 20 to the hearing device 2 by means of the coils 18, 22, and the secondary cell 16 is thereby charged.

The battery module 14 furthermore contains a circuit board 24, which is likewise already represented in a simplified fashion in FIG. 1 and may be seen in more detail in FIG. 2. The circuit board 24 contains a conductor track 26, which forms the reception coil 18. The circuit board 24 is also referred to as a printed circuit board or printed circuit (abbreviated to PCB). The conductor track 26 is made from a conductive material, here copper, and is applied on a substrate 28 of the circuit board or embedded in the substrate 28, or both.

Figure 3:
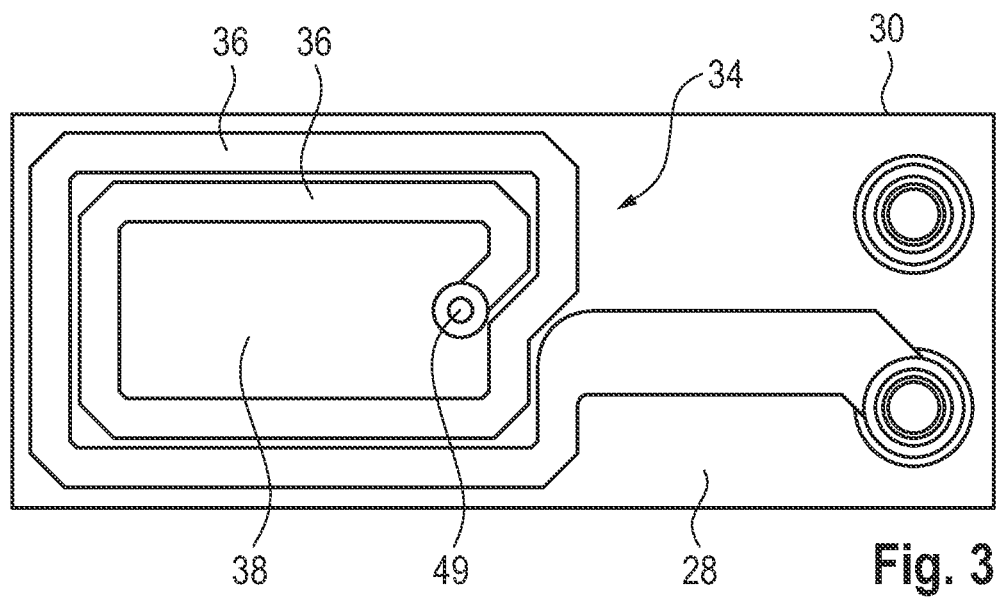
FIG. 3 is an illustration showing a first layer of the circuit board of FIG. 2.
Figure 4:
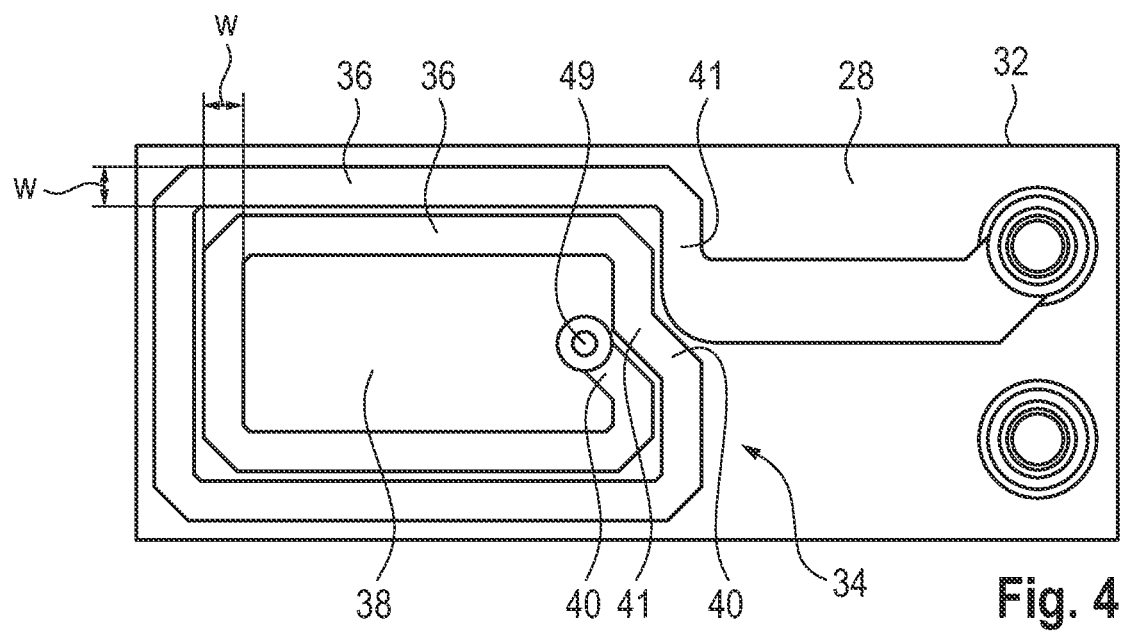
FIG. 4 is an illustration showing a second layer of the circuit board of FIG. 2.

The circuit board 24 contains a plurality of layers 30, 32, an individual layer 30, 32 also being referred to as a sheet. The term "layer" denotes in particular an individual plane which carries one or more conductor tracks. The circuit board 24 is accordingly a multilayer circuit board 24 having at least two layers 30, 32. For example, an upper side 30 as shown in FIG. 3 and a lower side 32 as shown in FIG. 4 respectively form a layer 30, 32, so that the circuit board 24 is a double-sided circuit board 24. In one variant, which is not explicitly shown, the circuit board 24 contains more than two layers 30, 32 and is then a so-called multilayer circuit board 24. The layers 30, 32 are stacked above one another in a stack direction S. As may be seen from FIGS. 2 to 4, the circuit board 24 is configured overall flatly, i.e. in the form of a plate. The circuit board 24 is configured to be either planar or bent, i.e. it does not necessarily extend along a single flat plane but, depending on the configuration of the hearing device, possibly follows a bent profile, for example in order to adapt to a contour in or on the housing or a component of the hearing device, as may be seen in FIG. 2. FIGS. 3 and 4 then respectively show an excerpt of the circuit board 24, which locally has a curved profile, of FIG. 2 in a plan representation for better clarity. The circuit board 24 explicitly shown here is furthermore flexible, i.e. pliable and resilient, in order to follow a curved profile as shown in FIG. 2.

The conductor track 26 extends over the plurality of layers 30, 32 while containing a conductor loop 34, having at least one turn 36, in each of the plurality of layers 30, 32. In this way, the reception coil 18 having a corresponding number of turns 36 is formed. One suitable structure of the conductor track 26 may be seen in FIGS. 3 and 4 as well as FIG. 5, which shows the conductor track 26 of FIGS. 3 and 4 in a perspective view and without the substrate 28. The multilayer structure of the conductor track 26 over a plurality of planes of the circuit board 24 may be seen clearly in FIG. 5. The specific dimensions of the turns 36 and their arrangement then determine the transmission properties of the reception coil 18. In the exemplary embodiment shown, the two conductor loops 34 of the different layers 30, 32 are configured substantially in the same way and furthermore are substantially congruent when viewed in the stack direction S, as may be seen particularly in FIG. 5. Like the circuit board 24, the conductor track 26 is also flexible and, to this end, is configured as a flat track.

Figure 5:
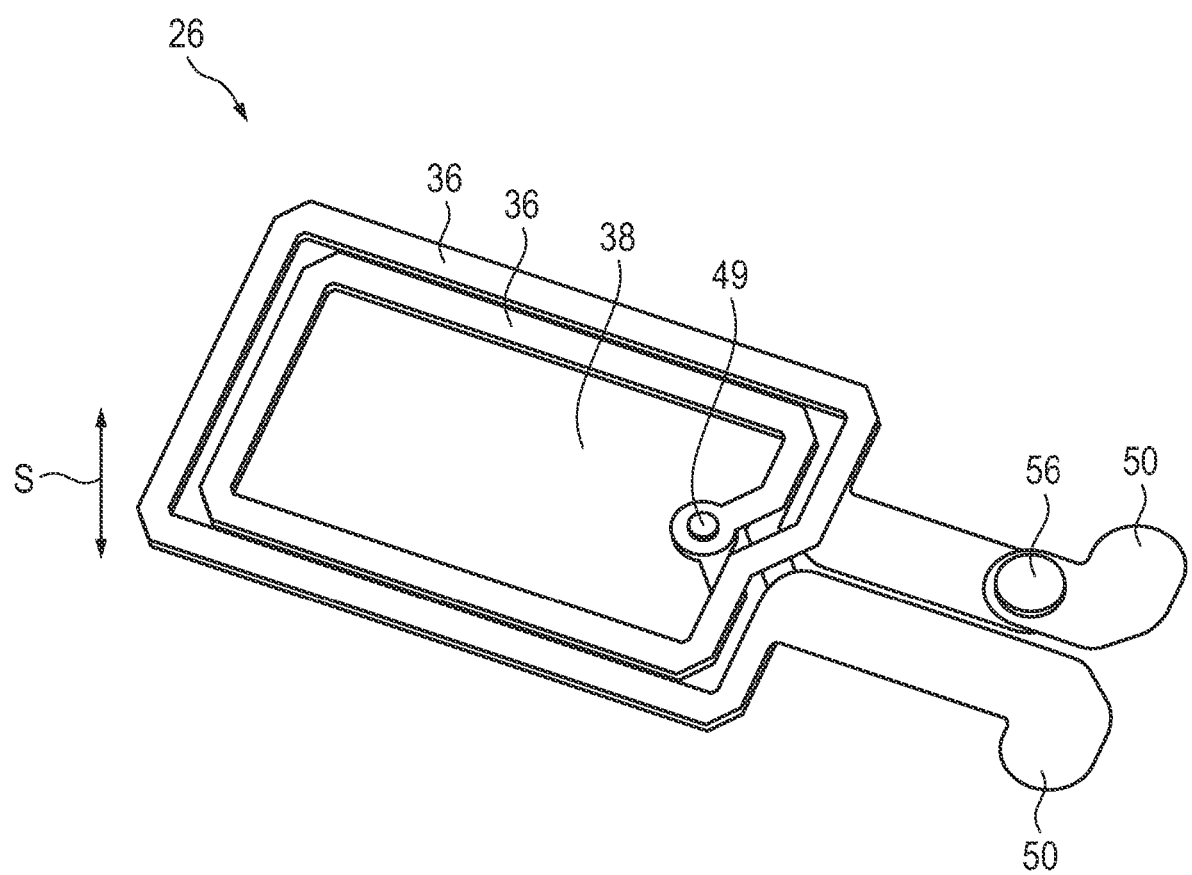
FIG. 5 is a perspective view of a conductor track of the circuit board of FIG. 2.

A turn 36 is characterized, as may be seen in FIGS. 3 to 5, in that it extends entirely within a single layer 30, 32. Furthermore, a turn 36 is characterized in that it forms an open loop, i.e. it circumscribes a free space 38, i.e. inner region, as fully as possible but while not being closed. A respective turn 36 accordingly comprises two ends 40, 41 which are not connected to one another, but lie laterally next to one another here. The turn 36 is furthermore shaped rectangularly here, although other shapes are in principle also suitable.

Figure 6:
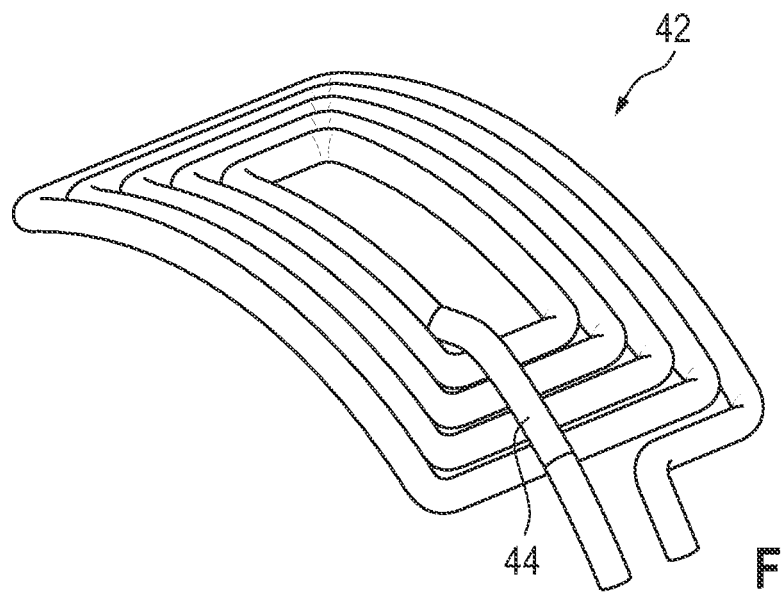
FIG. 6 is a perspective view of a coil.

The use of a conductor track 26 as the reception coil 18 leads, owing to the flat configuration, to a favorable form factor with which the reception coil 18 is configured more flatly than a coil 42 with similar transmission properties wound from wire, as shown for example in FIG. 6. In particular, a circuit board 24 avoids an end overlap of the conductor track leading to thickening, as is the case in FIG. 6 for the wire coil 42, in which one of the wire ends must be fed out from the interior of the coil 42 for connection and thereby forms an overlap 44.

Figure 7:
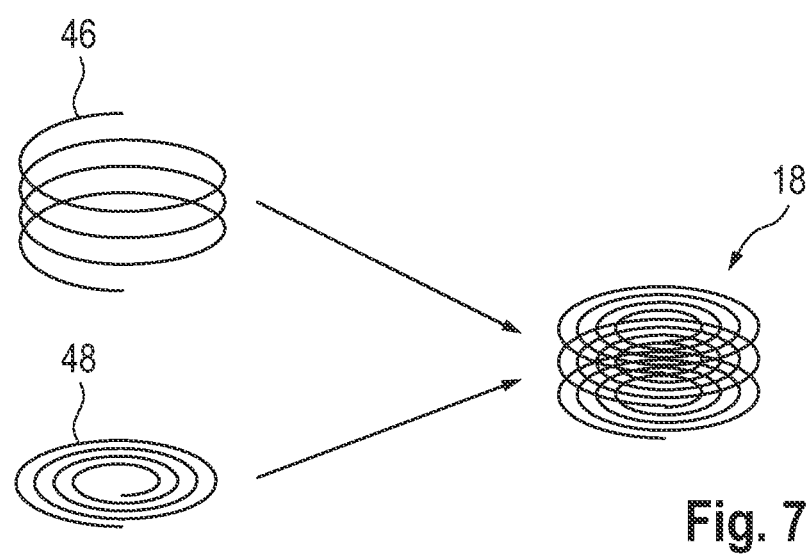
FIG. 7 is an illustration showing a combination of the concepts "spiral" and "helix" in order to form a spiroplanar helical coil.

In the exemplary embodiment of FIGS. 3 to 5, the conductor loops 34 together form a helix 46 and the turns 36 of a respective conductor loop 34 form a spiral 48, so that the reception coil 18 is configured as a spiroplanar helical coil. The underlying concept is illustrated in FIG. 7. The turns 36 of a respective conductor loop 34 form a spiral 48 within the corresponding layer 30, 32. Owing to the fact that the conductor track 34 extends over a plurality of layers 30, 32, a helix 46 is then formed. Overall, a plurality of spirals 48 are thus arranged above one another in the stack direction S and are connected in series to one another in such a way that a helix 46 is formed. To this end, the spirals 48 of neighboring layers 30, 32 are connected to one another at the end. In order to form a helix 46, at least two conductor loops 34, i.e. two layers 30, 32, are required. In order to form a spiral 38, at least two turns 36 within a layer 30, 32 are required.

In the configuration shown here, the reception coil 18 contains precisely two conductor loops 34, each having precisely two turns 36, so that there are in total four turns 36, which are distributed between two layers 30, 32. In the case of only two layers 30, 32, the production of the circuit board 24 is carried out for example by a conductor loop 34 respectively being formed on the upper side 30 and lower side 32 of the circuit board 24, as shown in FIGS. 3 and 4.

The conductor loops 34 are in the present case conductively connected by means of a through-contact 49 (also referred to as a "via") and are interconnected in series. The through-contact 49 may be seen clearly in FIG. 5 and is embedded in the substrate 28 of the circuit board 24, and thus reaches from one layer 30 to the neighboring layer 32. The through-contact 49 in this case extends in the stack direction S, and therefore perpendicularly to the layers 30, 32. In each case two conductor loops 34 are conductively connected by a through-contact 49, so that a series circuit of the conductor loops 34 is obtained overall. Because of the turns 36, a respective conductor loop 34 contains an inner end 40 and an outer end 41, and two inner ends 40 or two outer ends 41 are then always connected to one another by means of a respective through-contact 49. The two remaining ends 40, 41 of the top and bottom conductor loops 34 are then respectively connected to a terminal contact 50 for connecting the coil 18 for example to the secondary cell 16, to converter electronics 52, to charging electronics 54, or a combination thereof. In general, the circuit board 24 comprises two terminal contacts 50, which are respectively connected to an end of the conductor track 26, in order to connect the reception coil 18. In the exemplary embodiment shown, as may be seen in FIG. 5, the terminal contacts 50 are arranged together in the layer 30 of the circuit board 24, to which end for at least one of the terminal contacts 50 there is a through-contact 56 which connects this terminal contact 50 to an end of the conductor track 26 in the other layer 32.

The hearing device 2 contains charging electronics 54 for controlling the charging process for the secondary cell 16. As an alternative or in addition, the hearing device 2 contains converter electronics 52 for voltage conversion in order to produce suitable voltage values for the electronic components. The charging electronics 54 or the converter electronics 52, or both, are produced in FIG. 2 as integrated circuits or circuitry, or in a similar way, as part of the circuit board 24 and therefore part of the battery module 14.

In the exemplary embodiment shown, the conductor track 26 has a width w in the range of from 200 μm to 500 μm and a thickness d in the range of from 10 μm to 100 μm. These dimensions provide suitable transmission properties. The conductor track 26 in the present case furthermore has a rectangular cross section, the width w then being measured along the layer 30, 32 and the thickness d perpendicularly to the layer 30, 32.

Figure 8:
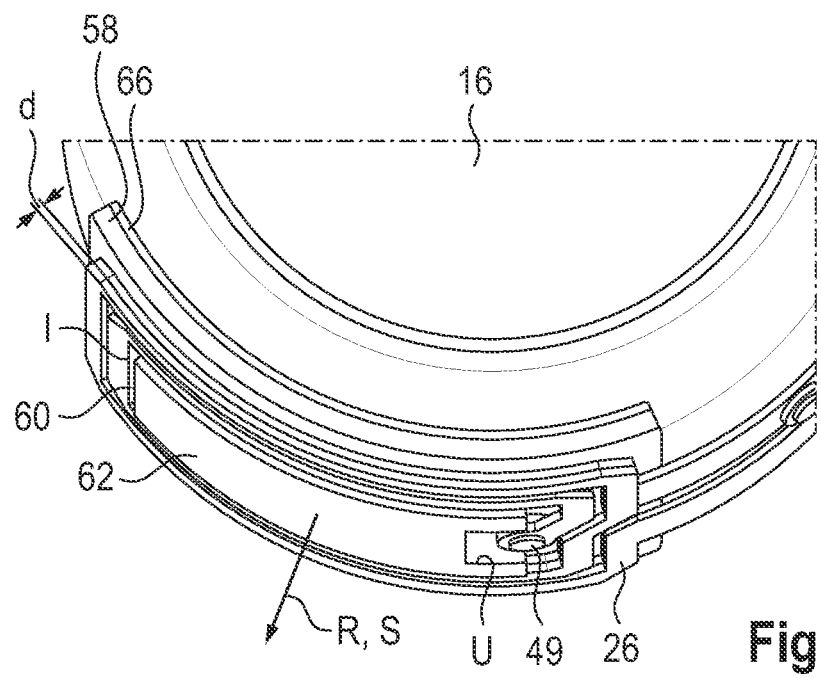
FIG. 8 is a perspective view of an excerpt of the battery module of FIG. 2.

Optionally, the circuit board 24 contains an additional ferrite layer 58, which fully covers the conductor loops 34, for amplifying the inductance of the reception coil 18. An exemplary embodiment with a ferrite layer has already been shown in FIG. 2. FIG. 8 shows a detail view of the exemplary embodiment of FIG. 2, in which the conductor track 26 and the ferrite layer 58 may be seen particularly clearly. The ferrite layer 58 consists in particular of a ferrite, and is connected to the rest of the layers 30, 32 in the present case by means of an adhesive. The ferrite layer 58 is in this case adhesively bonded onto an outer one of the layers 30, 32 and thus forms a termination in the stack direction S, so that the reception coil 18 is arranged entirely on only one side of the ferrite layer 58. The ferrite layer 58 is in this case arranged on the side of the reception coil 18 which faces away from the transmission coil 22 during the contactless charging. The ferrite layer 58 is thus emphatically not arranged between the two coils 18, 22.

The ferrite layer 58 is used to amplify the magnetic field which is generated by the transmission coil 22 during the contactless charging and to increase the magnetic flux density in the immediate vicinity of the ferrite layer 58. The ferrite layer 58 is therefore, as shown in FIGS. 2 and 8, arranged in immediate proximity to the reception coil 18, in order to deviate and concentrate the magnetic field in the direction of the latter. The reception coil 18 has a resonant frequency, which is used for the energy transmission. The transmission coil 22 has the same resonant frequency as the reception coil 18. At the resonant frequency, the loss should be as low as possible. The selection of the material for the ferrite layer 58 is then made according to a suitable constraint. The ferrite layer 58 is preferably likewise flexible.

In the exemplary embodiment shown, the ferrite layer 58 covers the conductor loops 34 and the entire reception coil 18 fully, i.e. not just partially. In the event of a displacement of the ferrite layer 58, the conductor loops 34 would no longer be fully covered and an optimal effect would then also no longer be achieved for the magnetic field.

As may be seen in FIG. 8, the circuit board 24 in the configuration shown therein contains a recess 60 inside the conductor loops 34 and the ferrite layer 58 contains an elevation 62 which protrudes into the recess 60, so that the elevation 62 is arranged inside the turns 36 and forms a ferrite core for the reception coil 18. The elevation 62 is also referred to as a "stamp" since the elevation 62 protrudes from the rest of the ferrite layer 58 in the stack direction S and forms an offset surface which protrudes into the free space 38 inside the conductor loops 34. The elevation 62 of the ferrite layer 58 according to FIG. 8 additionally has a circumferential contour U which generally follows an inner contour I of the conductor loops 34, so that the available free space 38 is optimally used and filled with the ferrite layer 58.

Figure 9:
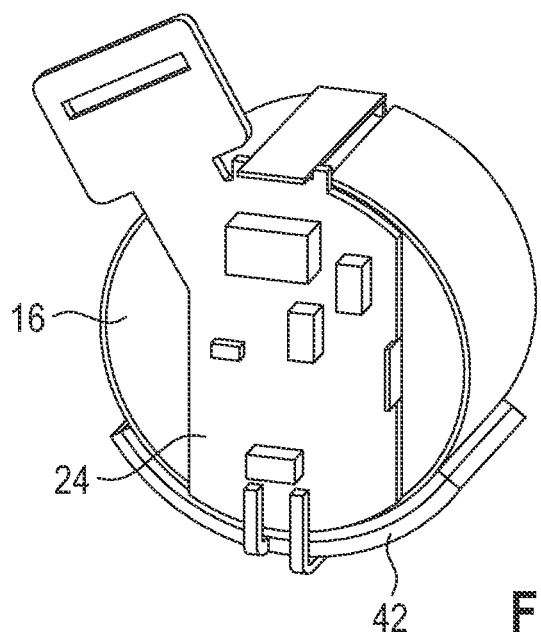
FIG. 9 is a perspective device 2 for the output of an audio signal to a user (not shown). The output is carried out by means of an output transducer, here acoustically through airborne sound by use of a so-called pickup 4. In the configuration shown here, the hearing device 2 is a hearing aid apparatus, also referred to in brief as a hearing aid, for assisting a user who has a hearing impairment. To this end, the hearing device 2 contains at least one acoustic input transducer, here two microphones 6, and a signal processor 8. The signal processor 8 is configured to process an input signal which is generated from ambient sound by the input transducer, and thereby to compensate at least partially for the user's hearing impairment. The hearing device 2 contains a housing 10 in which various components are accommodated. The following comments, however, also apply in principle for hearing devices 2 which are not in particular hearing aids.

The secondary cell 16 shown here is cylindrical and has a lateral surface 64. The circuit board 24 as well as the reception coil 18 are curved and follow the lateral surface 64, as may be seen particularly in FIG. 2. The cylindrical secondary cell 18 generally extends in a longitudinal direction along a longitudinal axis L. The lateral surface 64 encircles the longitudinal axis L and bounds the secondary cell 18 in a radial direction R perpendicular to the longitudinal direction. The circuit board 24 then has a curved profile, in such a way that the circuit board is likewise curved around the longitudinal axis L of the secondary cell 18. The stack direction S of the circuit board 24 therefore corresponds to the radial direction R. The reception coil 18 is then correspondingly curved. In this way, the circuit board 24 is accommodated in a particularly space-saving fashion. Compared with arrangement of the circuit board 24 on an end face of the secondary cell 18, as shown by way of example in FIG. 9, the radial arrangement shown in FIG. 2 is advantageous since it allows freer configuration and positioning of the reception coil 18. Furthermore, owing to the flat configuration of the circuit board 24 relative to the coil 42, it is possible to arrange the reception coil 18 and the circuit board 24 together along the lateral surface 64, which is not possible in the case of the coil 42 in FIG. 9.

Optionally, a shielding layer 66, which may be seen clearly in FIG. 2 and consists therein by way of example of copper, is arranged between the circuit board 24 and the secondary cell 18. Overall, in the radial direction R as seen from the inside outward, there is then an arrangement in FIG. 2 such that the secondary cell 18 is arranged internally, then the shielding layer 66, then the ferrite layer 58 and lastly the circuit board 24 with the reception coil 18. Further outward, these are then finally also followed by the housing 10 of the hearing device 2.

The following is a summary list of reference numerals and the corresponding structure used in the above description of the invention:

2 hearing device
4 pickup
6 microphone
8 signal processor
10 housing
12 electrical line
14 battery module
16 secondary cell
18 reception coil, coil
20 charger
22 transmission coil, coil
24 circuit board
26 conductor track
28 substrate (of the circuit board)
30 upper side, layer
32 lower side, layer
34 conductor loop (of the conductor track)
36 turn (of a conductor loop)
38 free space
40 inner end (of a turn)
41 outer end (of a turn)
42 coil
45 overlap
46 helix
48 spiral
49 through-contact
50 terminal contact
52 converter electronics
54 charging electronics
56 through-contact (for the terminal contact)
58 ferrite layer
60 recess
62 elevation (of the ferrite layer)
64 lateral surface (of the secondary cell)
66 shielding layer
d thickness (of the conductor track)
I inner contour (of a conductor loop)
L longitudinal axis
R radial direction
S stack direction
U circumferential contour (of the elevation)
w width (of the conductor track)

The invention claimed is:

1. A hearing device, comprising:
a battery module having a secondary cell and a reception coil for contactless charging of said secondary cell, said battery module further having a circuit board with a conductor track forming said reception coil, said circuit board having a plurality of layers, said conductor track extending over said plurality of layers and containing a conductor loop having at least one turn in each of said plurality of layers, said reception coil containing precisely two conductor loops, each having precisely two said turns, so that there are in total four said turns, which are distributed between two of said layers.

2. The hearing device according to claim 1, wherein said conductor loop on each of said layers together form a helix and said at least one turn of a respective said conductor loop forms a spiral, so that said reception coil is configured as a spiroplanar and helical coil.

3. The hearing device according to claim 1, wherein said conductor loops are conductively connected by means of a through-contact and are interconnected in series.

4. A hearing device, comprising:
a battery module having a secondary cell and a reception coil for contactless charging of said secondary cell, said battery module further having a circuit board with a conductor track forming said reception coil, said circuit board having a plurality of layers, said conductor track extending over said plurality of layers and containing a conductor loop having at least one turn in each of said plurality of layers, said conductor track having a width in a range of from 200 μm to 500 μm and a thickness in a range of from 10 μm to 100 μm.

5. A hearing device, comprising:
a battery module having a secondary cell and a reception coil for contactless charging of said secondary cell, said battery module further having a circuit board with a conductor track forming said reception coil, said circuit board having a plurality of layers, said conductor track extending over said plurality of layers and containing a conductor loop having at least one turn in each of said plurality of layers, said circuit board containing a ferrite layer, which fully covers said conductor loop, for amplifying an inductance of said reception coil.

6. The hearing device according to claim 5, wherein:
said circuit board has a recess formed therein inside said conductor loops; and
said ferrite layer has an elevation which protrudes into said recess, so that said elevation is disposed inside said turns and forms a ferrite core for said reception coil.

7. The hearing device according to claim 1, wherein:
said secondary cell is cylindrical and has a lateral surface; and
said circuit board and said reception coil are curved and follow said lateral surface.

8. The hearing device according to claim 1, wherein the hearing device is a behind-the-ear hearing aid or a receiver-in-canal hearing aid.

9. The hearing device according to claim 4, wherein said conductor loop on each of said layers together form a helix and said at least one turn of a respective said conductor loop forms a spiral, so that said reception coil is configured as a spiroplanar and helical coil.

10. The hearing device according to claim 4, wherein said conductor loops are conductively connected by means of a through-contact and are interconnected in series.

11. The hearing device according to claim 4, wherein:
said secondary cell is cylindrical and has a lateral surface; and
said circuit board and said reception coil are curved and follow said lateral surface.

12. The hearing device according to claim 4, wherein the hearing device is a behind-the-ear hearing aid or a receiver-in-canal hearing aid.

13. The hearing device according to claim 5, wherein said conductor loop on each of said layers together form a helix and said at least one turn of a respective said conductor loop forms a spiral, so that said reception coil is configured as a spiroplanar and helical coil.

14. The hearing device according to claim 5, wherein said conductor loops are conductively connected by means of a through-contact and are interconnected in series.

15. The hearing device according to claim 5, wherein:
said secondary cell is cylindrical and has a lateral surface; and
said circuit board and said reception coil are curved and follow said lateral surface.

16. The hearing device according to claim 5, wherein the hearing device is a behind-the-ear hearing aid or a receiver-in-canal hearing aid.

* * * * *